United States Patent [19]

Kim

[11] Patent Number: 5,675,140

[45] Date of Patent: Oct. 7, 1997

[54] AUTOFOCUS CONTROL DEVICE WITH A LIGHT SOURCE

[75] Inventor: Sang-Cheol Kim, Kyungki-do, Rep. of Korea

[73] Assignee: Samsung Aerospace Industries, Ltd., Kyungsangnam-do, Rep. of Korea

[21] Appl. No.: 598,956

[22] Filed: Feb. 9, 1996

[30] Foreign Application Priority Data

Feb. 6, 1996 [KR] Rep. of Korea .......... 95-2500

[51] Int. Cl.$^6$ .............. G02B 7/04; G02B 27/64
[52] U.S. Cl. .............. 250/201.2; 250/201.4; 356/400; 355/55
[58] Field of Search .............. 250/201.2, 201.4, 250/201.5, 548; 356/399, 400, 401; 355/53, 55

[56] References Cited

U.S. PATENT DOCUMENTS

| | | |
|---|---|---|
| 4,687,322 | 8/1987 | Tanimoto et al. .......... 355/55 |
| 4,701,606 | 10/1987 | Tanimoto et al. .......... 250/201.4 |
| 5,286,963 | 2/1994 | Torigoe .......... 250/201.2 |
| 5,483,056 | 1/1996 | Imai .......... 250/201.4 |
| 5,489,966 | 2/1996 | Kawashima et al. .......... 355/55 |

*Primary Examiner*—Edward P. Westin
*Assistant Examiner*—Kevin Pyo
*Attorney, Agent, or Firm*—Finnegan, Henderson, Farabow, Garrett & Dunner, L.L.P.

[57] ABSTRACT

An optical positioning device using astigmatic optical elements. A laser diode emits astigmatic, elliptically shaped light which is not corrected. A first lens condenses the light and transmits the light to an object to be positioned. The light reflected off of the object is monitored while the object is moved. Because of astigmatism, the first lens does not have a true focal point. There is a point, however, where the vertical and horizontal components of the transmitted light are equal. The first lens is positioned so that the desired position of the object corresponds to this equal point.

17 Claims, 3 Drawing Sheets

AUTOFOCUS CONTROL DEVICE WITH A LIGHT SOURCE

BACKGROUND OF THE INVENTION

(1) Field of the Invention

The present invention relates generally to an autofocus control device using an elliptical light. In equipment for lithography-semiconductor manufacturing and compact disk (CD) players, the present invention relates to an autofocus control device using an elliptical light, that either places a workpiece in the range of focus-depth of a projection lens or places a compact disk at the focus plane of a reading beam.

(2) Description of the Prior Art

Light-exposure equipment for lithography-semiconductor manufacturing shifts a geometrical-shaped pattern on a mask into a thin screen covered surface of a semiconductor wafer. To shift the patterns on the mask, the wafer and workpiece must be within the focus depth-of-field of a projection lens.

Information is recorded as pits in an optical disk, and a light source reads the information. Lasers typically produce the reading beam light source. According to an electric signal transmitted from the reflected light, after reading the information, the reader places the disk at the focal point of the laser beam.

In optical systems for semiconductor manufacturing and compact disk players, an autofocus control device is used to place disk, wafer, and workpiece in the exact focus plane.

In light-exposure and light pickup devices, the autofocus control uses circular light. Laser diodes, however, emit astigmatic, elliptically shaped light.

For example, a lens in the light-exposure equipment condenses circularly shaped light on the wafer or workpiece. The light-exposure equipment then condenses the reflected light onto a photodetector. At this time, any change in position is detected, and the focus position of the wafer and workpiece is also detected. The wafer and workpiece is then placed within the focus depth of field.

An autofocus control device may use astigmatism. For example, in a compact disk player, an elliptical light beam emitted from laser diode is converted into a circular light beam, and astigmatism enables the disk to be located on the focus plane. Thus, while camera lenses are designed to reduce astigmatism, the light pickup device uses the largest possible astigmatism to detect focus errors.

The autofocus control device using astigmatism converts emitted light into circular-shaped light. A cylindrical lens then transmits the circular-shaped light into elliptical-shaped light. A spherical lens condenses the light at a workpiece. A four way divided quad detector detects light reflected from the workpiece and detects the position of the workpiece by the detected signal. In the above-mentioned manner, an autofocus control device generates an astigmatism using the cylindrical lens and the spherical lens.

SUMMARY OF THE INVENTION

The advantages and purpose of the invention will be set forth in part in the description which follows, and in part will be obvious from the description, or may be learned by practice of the invention. The advantages and purpose of the invention will be realized and attained by means of the elements and combinations particularly pointed out in the appended claims.

An object of the present invention is to provide an automatic controller using a simple laser diode.

A further object of the invention is to provide an automatic controller which does not convert elliptical light into circular light, but rather uses the elliptical light to automatically position an object.

Another object of the present invention is to provide an automatic controller which places a workpiece, a wafer, and/or an optical disk within the focus depth of a projection optical system.

To achieve the objects and purposes of the invention, the construction of the invention is as follows. A light source emits oval light emitted from the light source. A first reflector reflects the oval light from the 1st spherical lens and transmits the light to an object to detect the position.

A second reflector reflects the light reflected by the object to detect the position. A second spherical lens condenses the light reflected from the second reflector. A photodetector converts light from the second spherical lens into corresponding electric signals and outputs the signals. A control means reads position information of corresponding object to detect the position according to the electric signal from the photodetector and according to the read information, outputs a control signal. A position adjusting part receives the control signal and adjusts the position of the object.

The light source of the preferred embodiment of this invention is commonly constructed by laser diode. This invention is not limited to the embodiment described here and can be modified within the scope of the invention.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DETAILED DESCRIPTION OF THE PREFERRED EMBODIMENTS

According to a preferred embodiment of the invention, an optical positioning device uses astigmatic optical elements. A laser diode emits astigmatic, elliptically shaped light which is not corrected. A first lens condenses the light and transmits the light to an object to be positioned. The light reflected off of the object is monitored while the object is moved. Because of astigmatism, the first lens does not have a true focal point. There is a point, however, where the vertical and horizontal components of the transmitted light are equal. The first lens is positioned so that the desired position of the object corresponds to this equal point.

Figure 1:
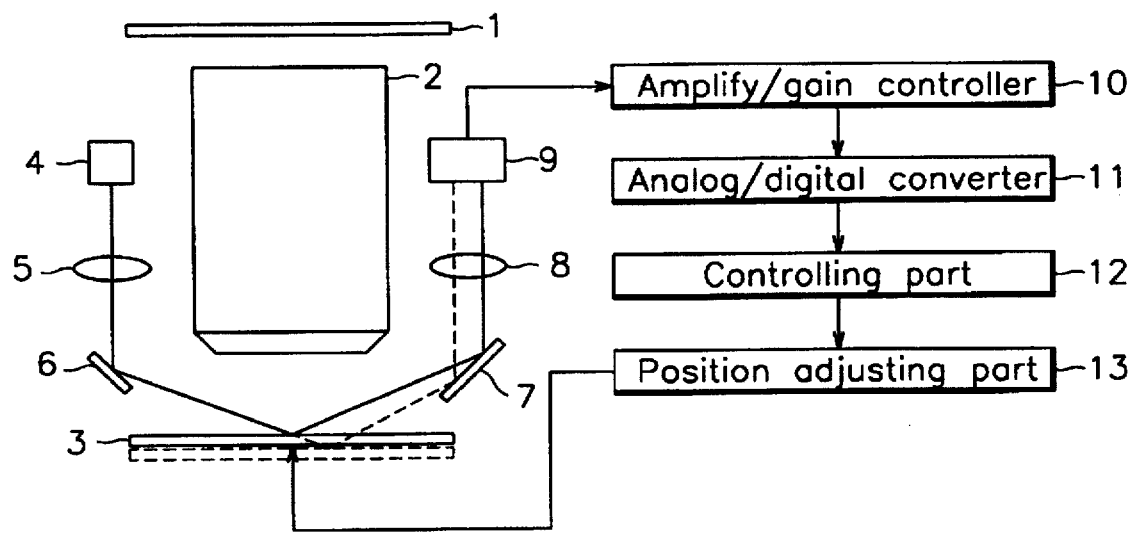
FIG. 1 is a perspective view of an autofocus control device according to a first embodiment of the present invention.

Referring to FIG. 1, the first embodiment of the present invention is a projection optical semiconductor manufacturing device. A mask 1, has a pattern to be projected. A projection lens 2 projects the light passing through the mask 1. A workpiece 3 comprises a wafer and a workpiece to shift the patterns on the mask.

A laser diode 4 emits oval light to detect the position of workpiece 3. A first spherical lens S condenses the oval light emitted from laser diode 4. A first reflector 6 reflects the light condensed from the spherical lens 5 to the workpiece 3. A second reflector 7 reflects the light reflected by the first reflector 6 to the workpiece 3 again. A second spherical lens 8 condenses the light reflected by the second reflector 7 and outputs the light. A photodetector 9 detects the light projected from the second spherical lens 8 and outputs a corresponding electric signals.

An amplifier/gain controller 10 amplifies the electric signals from the photodetector 9. An A/D converter 11 receives the amplified electric signals and converts the analog signals into digital signals. A controlling part 12 receives the digital signals and determines the position of the workpiece 3. The controlling part 12 then outputs a controlling signal to position the workpiece 3. A position adjusting means 13 controls the position of the workpiece 3 according to the controlling signal from the controlling part 12.

The workpiece 3 resets on a non-drawn stage (not shown). The position adjusting means 13 moves the non-drawn stage to place the stage in the image-position.

The invention can be used as the light arranging means of light-exposure equipment, to read the information on a disk.

A non-drawned laser power controller is used as arranging light source in light-exposure equipment, and also, emits a regular shaped quantity of light.

Figure 2:
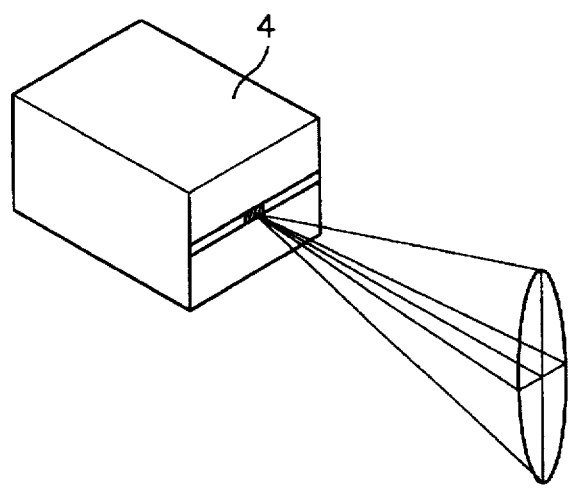
FIG. 2 is a schematic diagram of a laser diode.

When a user operates the power device, a laser diode 4 emits light. The light emitted from the laser diode 4, as shown in FIG. 2, has astigmatism and an elliptical or oval-shape. The elliptical light from the laser diode 4 is condensed through first spherical lens 5 and transmitted to the workpiece 3 by the reflector 6.

Figure 3:
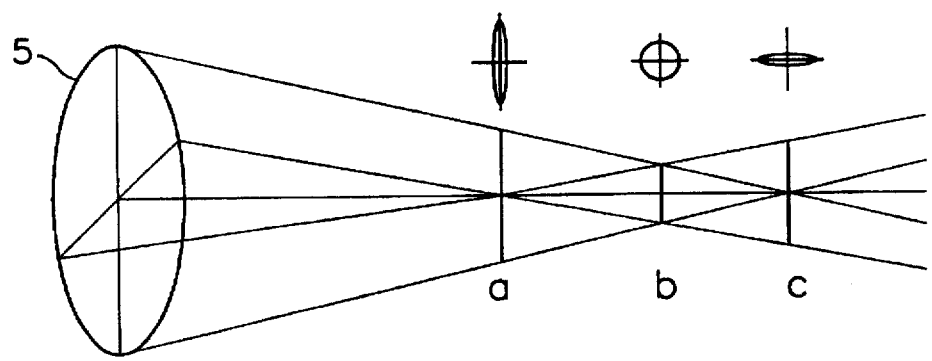
FIG. 3 is a schematic diagram illustrating the cross-sectional shape of transmitted light beams according to the first embodiment of the invention.

In this application, astigmatism refers to a difference in focus between vertical and horizontal components of a light beam FIG. 3 illustrates the cross-sectional areas of light emitted from the laser diode 4 and condensed by the first spherical lens 5. As the light emitted from the laser diode 4 comprises astigmatism, horizontal light is condensed at a; vertical light is condensed at c; and the cross-sectional area is circular at b.

Referring again to FIG. 3, as the horizontal light is focused at position a and the vertical light is not, the light at a is oval-shaped. Because the vertical axis is out of focus at position a, the vertical component of the cross-sectional area is longer than the horizontal component.

The lens 5 focuses the vertical component of the light at position c, but the horizontal component is out of focus at position c. Therefore, the cross-section of the light is oval-shaped with a longer (out of focus) horizontal axis.

At position b, both the horizontal and the vertical components of the light are out of focus. However, the horizontal and vertical components are equally out of focus at position b, and a circular cross-sectional area results.

Reflector 6 reflects the light onto the workpiece 6. The lens 5 and the reflector 6 are positioned so that the circular cross-sectional light, as shown at position b in FIG. 3, will impinge on workpiece 3 if workpiece 3 is properly positioned.

Figure 4A:
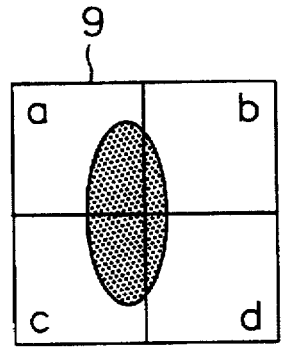
FIGS. 4A-4C are state-diagrams of the cross sections of light impinging on a photodetector.

In the preferred embodiment, the photodetector 9 has four photodiodes arranged as shown in FIG. 4A. The photodetector, thus, divides the light beams into four segments a–d and outputs corresponding electrical signals. The signals from the photodetector 9 are adjusted into proper values by amplify/gain controller 10 and converted by A/D (Analog/Digital) converter 11. According to the digital signals, the controlling part 12 adjusts the wafer and workpiece, namely, the position of the stage which contains the workpiece.

Figure 4B:
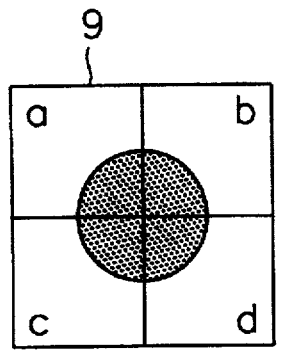
Figure 4C:
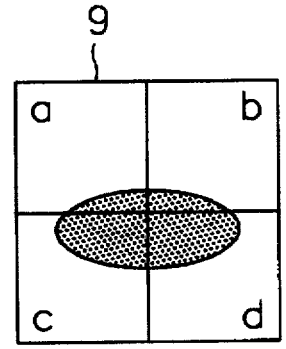

FIG. 4A shows the shape and position of light impinging on the photodetector 9 corresponding to position a. FIG. 4B shows the shape and position of light impinging on the photodetector 9 when workpiece 3 is located exactly at the image point of the projection lens 2 corresponding to position b. FIG. 4C shows the shape and position of light impinging on the photodetector 9, when workpiece 3 is located inside of the image point of projection lens 2 corresponding to position c.

The controlling part 12 determines the position of the workpiece 3 from the signals a–d from the photodetector 9. The controlling part 12 calculates:

$$(a+b)-(c+d)=\alpha \quad (1)$$

$$(a+c)-(b+d)=\beta \quad (2)$$

The position adjusting means 13 moves the workpiece 3 to calculate a series of $\alpha$' s and $\beta$' s. When $\alpha$ and $\beta$ are a minimum or zero, the above controlling part 12 regards that workpiece 3 is located at the image point of the projection lens 2. The controlling part 12 adjusts the position of workpiece 3, according to the signals detected by the photodetector 9. The workpiece 3 is preferably positioned at the focal point of the projection lens 2 or at least within an acceptable depth of field.

The position adjusting part 13 and controlling part 12 are adjustable.

Figure 5:
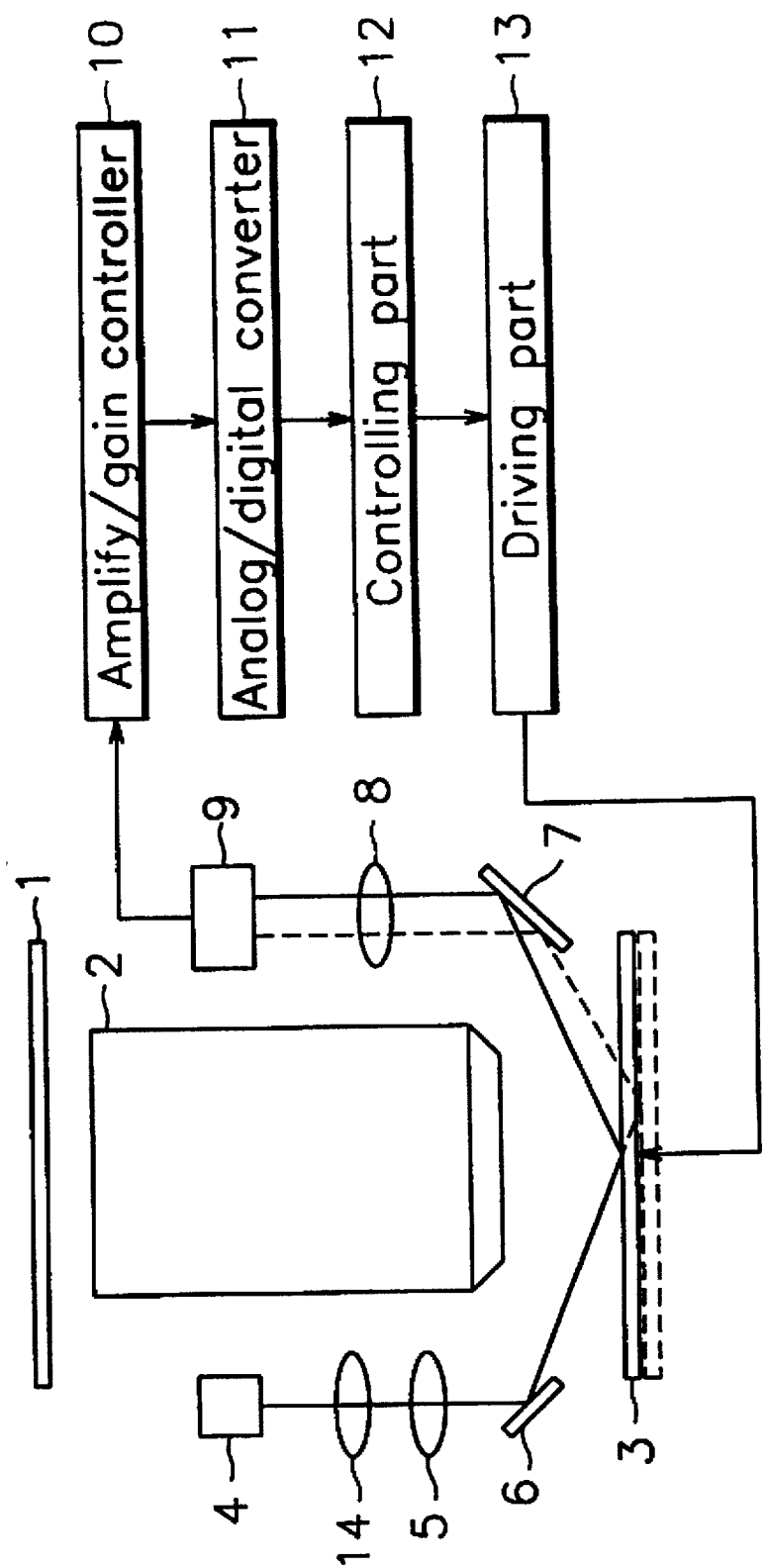
FIG. 5 is a perspective view of an autofocus control device according to a second embodiment of the present invention.

The second embodiment of the invention is also an autofocus control device using a laser diode. Referring to FIG. 5, the second embodiment includes a cylindrical lens 14 between the laser diode 4 and the first spherical lens 5 to increase astigmatism.

The cylindrical lens 14 has an astigmatism in relation to circular light in accordance with an embodiment of this invention. The position information of workpiece 3 from photodetector 9 is obtained and the operating system is similar to the first embodiment. However, the astigmatism of light emitted from cylindrical lens 14 is increased and the intervals between positions a, b, and c are extended. The photodetector 9, therefore, conveniently obtains the position information.

Thus, the positioning device operates without converting the elliptical light emitted from the laser diode into circular light. The workpiece of light-exposure equipment or the disk of a CD player is located, in the range of focus-depth or at the exact focus position. The present invention differs from devices which combine a cylindrical lens and a spherical lens again, and then makes an astigmatism, after forming the elliptical light into the spherical light.

The present invention is designated to detect conveniently the position information, and an autofocus control device using a laser diode that reduces the expense of production and the occupied area.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A device for positioning an object using astigmatic optical elements without correcting astigmatism, the device comprising:

a light source for emitting light, the light having astigmatism and being elliptical;

a first lens for condensing the elliptical light emitted from the light source and for transmitting the light to the object;

a second lens for condensing light reflected off of the object;

a photodetector for receiving light from the second lens and converting the received light into electrical signals; and control means for receiving the electrical signals and for controlling the position of the object in accordance with the electrical signals.

2. The device as claimed in claim 1, wherein the first and second lenses are spherical lenses.

3. The device as claimed in claim 2, further comprising a first reflector in the light path between the first lens and the object and a second reflector in the light path between the object and the second lens.

4. The device as claimed in claim 2, wherein the photodetector comprises four photodiodes.

5. The device as claimed in claim 3, wherein the control means comprises:

an amplifier circuit for receiving and adjusting the electrical signals;

an analog to digital converter for converting analog signals from the amplifier circuit to digital signals;

a processor circuit for receiving the digital signals and for determining the position of the object in accordance with the digital signals, the processor circuit producing a control signal; and means for moving the object in accordance with the control signal.

6. The device as claimed in claim 1, wherein the light source comprises laser diode.

7. An optical disk player including the device claimed in claim 1.

8. A projection optical system for manufacturing semiconductor devices including the device claimed in claim 1.

9. A device for positioning an object using astigmatic optical elements without correcting astigmatism, the device comprising:

a light source for emitting light, the light having astigmatism and being elliptical;

a first lens for condensing the elliptical light emitted from the light source and for transmitting the light to the object;

a cylindrical lens in the light path between the light source and the object;

a second lens for condensing light reflected off of the object;

a photodetector for receiving light from the second lens and for converting the received light into electrical signals; and control means for receiving the electrical signals and for controlling the position of the object in accordance with the electrical signals.

10. The device as claimed in claim 9, wherein the first and second lenses are spherical lenses.

11. The device as claimed in claim 10, further comprising a first reflector in the light path between the first lens and the object and a second reflector in the light path between the object and the second lens.

12. The device as claimed in claim 10, wherein the photodetector comprises four photodiodes.

13. The device as claimed in claim 11, wherein the control means comprises:

an amplifier circuit for receiving and adjusting the electrical signals;

an analog to digital converter for converting analog signals from the amplifier circuit to digital signals;

a processor circuit for receiving the digital signals and for determining the position of the object in accordance with the digital signals, the processor circuit producing a control signal; and means for moving the object in accordance with the control signal.

14. The device as claimed in claim 9, wherein the light source is comprised of laser diode.

15. An optical disk player including the device claimed in claim 9.

16. A projection optical system for manufacturing semiconductor devices including the device claimed in claim 9.

17. A method of positioning an object at a desired position using astigmatic optical elements without correcting astigmatism, the method comprising the steps of:

providing an astigmatic beam of light, the astigmatic beam of light having a horizontal component and a vertical component, and the astigmatic beam of light having an equilibrium point at which the horizontal and vertical components are equally out of focus;

transmitting the light to the object;

moving the object;

monitoring the light reflected off of the object; and detecting the equilibrium point.

* * * * *